(12) United States Patent
Johnson et al.

(10) Patent No.: US 6,978,673 B2
(45) Date of Patent: Dec. 27, 2005

(54) METHODS AND SYSTEMS FOR SIMULTANEOUSLY FABRICATING MULTI-FREQUENCY MEMS DEVICES

(75) Inventors: Burgess R. Johnson, Bloomington, MN (US); Max C. Glenn, Chanhassen, MN (US); William P. Platt, Columbia Heights, MN (US); David K. Arch, Bloomington, MN (US); Mark W. Weber, Zimmerman, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/360,962

(22) Filed: Feb. 7, 2003

(65) Prior Publication Data
US 2004/0154400 A1    Aug. 12, 2004

(51) Int. Cl.⁷ ................................. G01P 9/04
(52) U.S. Cl. ............... 73/504.12; 73/504.16; 438/50
(58) Field of Search ............ 73/504.12, 504.14, 73/504.16; 438/50, 52

(56) References Cited

U.S. PATENT DOCUMENTS

| | | |
|---|---|---|
| 5,025,346 A | 6/1991 | Tang et al. |
| 5,349,855 A | 9/1994 | Bernstein et al. |
| 5,392,650 A | 2/1995 | O'Brien et al. |
| 5,458,000 A | 10/1995 | Burns et al. |
| 5,496,436 A | 3/1996 | Bernstein et al. |
| 5,507,911 A | 4/1996 | Greiff |
| 5,581,035 A | 12/1996 | Greiff |
| 5,646,348 A | 7/1997 | Greiff et al. |
| 5,804,087 A * | 9/1998 | Lee et al. ...................... 438/52 |
| 5,892,153 A | 4/1999 | Weinberg et al. |
| 5,920,012 A | 7/1999 | Pinson |
| 5,952,574 A | 9/1999 | Weinberg et al. |
| 6,040,625 A | 3/2000 | Ip |
| 6,230,566 B1 | 5/2001 | Lee et al. |
| 6,257,059 B1 | 7/2001 | Weinberg et al. |
| 6,311,556 B1 | 11/2001 | Lefort et al. |
| 6,350,983 B1 | 2/2002 | Kaldor et al. |
| 6,426,538 B1 | 7/2002 | Knowles |
| 6,481,285 B1 | 11/2002 | Shkel et al. |
| 6,571,630 B1 * | 6/2003 | Weinberg et al. ........ 73/504.16 |
| 2001/0042404 A1 | 11/2001 | Yazdi et al. |
| 2002/0066317 A1 | 6/2002 | Lin |
| 2002/0093067 A1 | 7/2002 | Knowles |
| 2002/0167248 A1 | 11/2002 | Chua et al. |
| 2002/0178817 A1 | 12/2002 | Selvakumar et al. |
| 2002/0184949 A1 | 12/2002 | Gianchandani et al. |

FOREIGN PATENT DOCUMENTS

| | | | |
|---|---|---|---|
| WO | WO 00/57194 | * | 9/2000 |
| WO | WO 01/22094 A2 | | 3/2001 |

OTHER PUBLICATIONS

International Search Report dated Aug. 2, 2004, Application No. PCT/US2004/003727.

*Primary Examiner*—John E. Chapman
(74) *Attorney, Agent, or Firm*—Andrew Abeyta, Esq.; Armstrong Teasdale LLP (57) ABSTRACT

A method for providing micro-electromechanical systems (MEMS) devices with multiple motor frequencies and uniform motor-sense frequency separation is described. The devices each include at least one proof mass, each proof mass being connected to a substrate by a system of suspensions. The method includes controlling the resonant frequencies of the MEMS device by adjusting at least two of a mass of the proof masses, a bending stiffness of the proof masses, a length of the suspensions, and a width of the suspensions.

32 Claims, 11 Drawing Sheets

METHODS AND SYSTEMS FOR SIMULTANEOUSLY FABRICATING MULTI-FREQUENCY MEMS DEVICES

BACKGROUND OF THE INVENTION

This invention relates generally to micro-electromechanical systems (MEMS), and more specifically, to multi-frequency MEMS devices capable of simultaneous fabrication.

Micro-electromechanical systems (MEMS) integrate electrical and mechanical components on the same substrate, for example, a silicon substrate, using microfabrication technologies. The electrical components are fabricated using integrated circuit processes, while the mechanical components are fabricated using micromachining processes that are compatible with the integrated circuit processes. This combination makes it possible to fabricate an entire system on a chip using standard manufacturing processes.

One common application of MEMS devices is in the design and manufacture of sensor devices. The mechanical portion of the sensor device provides the sensing capability, while the electrical portion of the sensor device processes the information received from the mechanical portion. One example of a MEMS device is a gyroscope. Some inertial measurement units (IMUs) incorporate one or more MEMS gyroscopes.

One known type of MEMS gyroscope uses a vibrating element to sense angular rate through the detection of a Coriolis acceleration. The vibrating element is put into oscillatory motion along the X-axis (motor axis), which is parallel to the substrate, in a resonant mode of vibration referred to as a motor mode. Once the vibrating element is put in motion, it is capable of detecting angular rates induced by the substrate being rotated about the Z-axis (input axis), which is perpendicular to the substrate. Coriolis acceleration occurs along the Y-axis (sense axis), which is perpendicular to both the X-axis and the Z-axis, causing oscillatory motion along the Y-axis, in a resonant mode referred to as a sense mode. The amplitude of oscillation of the sense mode is proportional to the angular rate of the substrate. Such a MEMS gyroscope is sometimes referred to as a z-axis gyroscope or out-of-plane gyroscope. As used herein a z-axis gyroscope is a gyroscope which measures rotation about an axis perpendicular to a substrate surface. Another type of MEMS gyroscope, known as an in-plane gyroscope, measures rotation about the Y-axis, by detecting sense mode motion along the Z-axis caused by the Coriolis acceleration.

In a specific IMU, which incorporates three MEMS gyroscopes, the three gyroscopes should have different motor frequencies, and the output voltage per unit angular rotation rate, sometimes referred to as scale factor, should be about the same. If the motor frequencies of all three gyroscopes are not different, then a noise-to-signal ratio of the IMU output signal, as measured by angular random walk of the IMU, is higher. Having the same scale factor for all three devices is most easily obtained if a motor-sense frequency separation is about the same for all three gyroscopes. For ease in fabrication, it is preferred to provide all three gyroscopes from the same wafer without requiring additional fabrication process steps to provide the three different motor frequencies while also retaining a motor-sense frequency separation which is the same for all three gyroscopes.

BRIEF SUMMARY OF THE INVENTION

In one aspect, a method for providing micro-electromechanical systems (MEMS) devices with multiple motor frequencies and uniform motor-sense frequency separation is provided. The devices each include at least one proof mass connected to a substrate by a system of suspensions. The method comprises controlling the resonant frequencies of the MEMS device by adjusting at least two of a mass of the proof masses, a bending stiffness of the proof masses, lengths of the suspensions, and widths of the suspensions.

In another aspect, a micro-electromechanical systems (MEMS) device is provided. The device comprises at least one sense plate attached to a substrate, at least one proof mass separated from each sense plate, and a plurality of suspensions connecting the proof masses to the substrate. The suspensions are configured to provide separation between the sense plates and respective proof masses. The device also includes at least one anchor which connects at least one of the suspensions to the substrate. Resonant frequencies of the MEMS device are controlled by adjusting at least two of a mass of the proof masses, a bending stiffness of the proof masses, lengths of the suspensions, and widths of the suspensions.

In still another aspect, a micro-electromechanical systems device is provided which comprises at least one proof mass, a plurality of suspensions attached to the proof masses and configured to suspend the proof masses, at least one stiffener beam coupled to at least one of the suspensions, and at least one fusible link extending from each stiffener beam. Removing the fusible link changes one or more resonant frequencies of the device by adjusting a stiffness of the suspensions.

In yet another aspect, an inertial measurement unit comprising three orthogonally situated micro-electromechanical systems (MEMS) gyroscopes is provided. Each gyroscope comprises at least one sense plate or sense comb fingers, at least one proof mass separated from each sense plate or sense comb finger, and a plurality of suspensions attached between the proof masses and a substrate. The suspensions are configured to provide separation between the sense plates and respective proof masses. The resonant frequencies of said gyroscope are controlled by adjusting at least two of a mass of the proof masses, a bending stiffness of the proof masses, a length of the suspensions, and a width of the suspensions.

In another aspect, a method for providing micro-electromechanical systems (MEMS) devices with multiple motor frequencies and uniform motor-sense frequency separation is provided. The devices each include at least one proof mass suspended above a substrate by suspensions. The method comprises fabricating at least one fusible link coupled to at least one suspension and burning through the at least one fusible link to adjust a resonant frequency of the device.

DETAILED DESCRIPTION OF THE INVENTION

Figure 1:
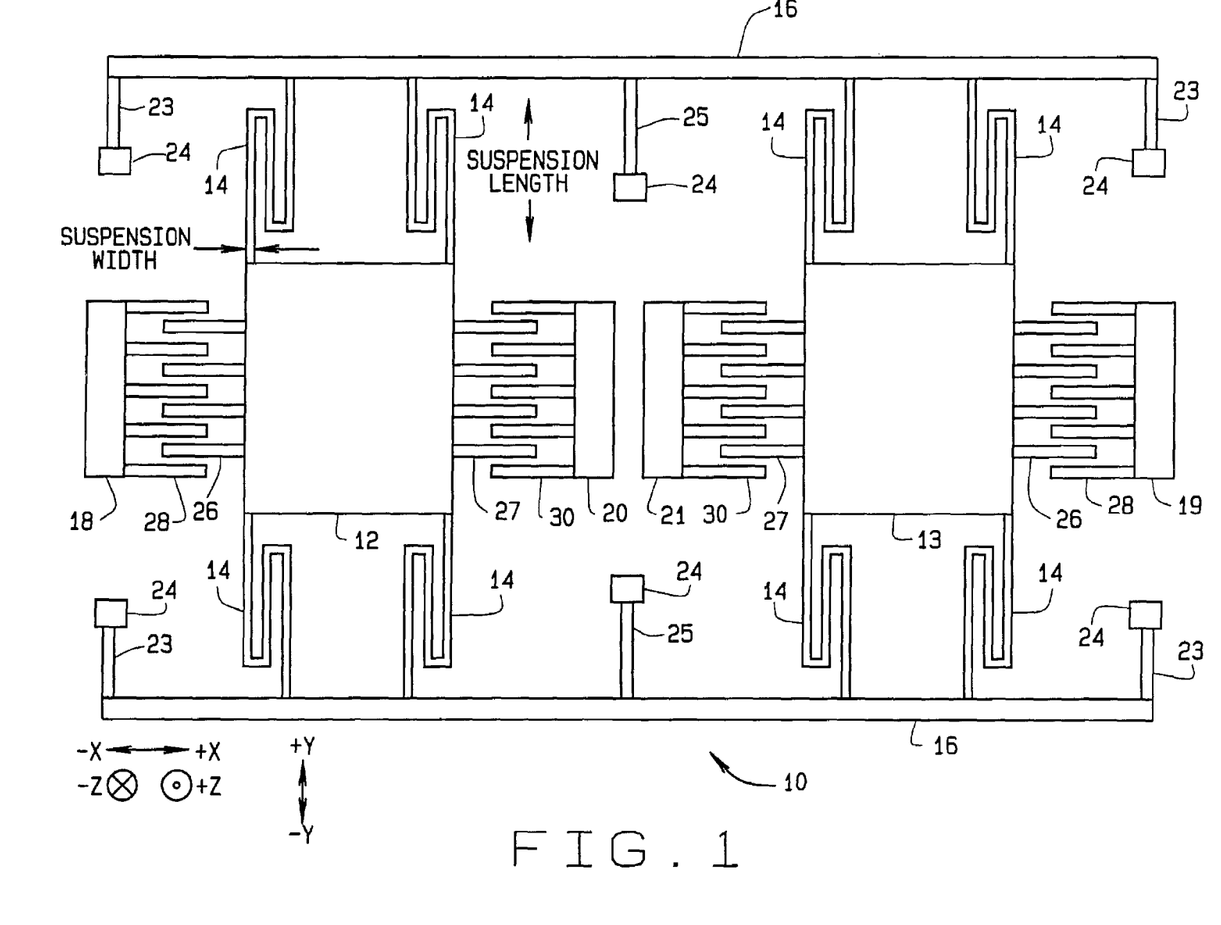
FIG. 1 is an illustration of an in-plane micro-electromechanical system gyroscope.

FIG. 1 illustrates a plan view of a known exemplary in-plane micro-electromechanical system (MEMS) gyroscope 10. MEMS gyroscope 10 is formed on a substrate (not shown) and includes at least one proof mass 12, 13, a plurality of suspensions 14 for supporting proof masses 12, 13, and at least one cross beam 16 to which suspensions 14 are connected. Gyroscope 10 includes motor drive combs 18, 19, motor pickoff combs 20, 21, and sense plates (not shown), which correspond to individual proof masses 12, 13. Gyroscope 10 also includes anchors 24 for cross beams 16. In the embodiment shown, anchors 24 are attached to cross beams 16 utilizing corner suspensions 23 and center suspensions 25.

Proof masses 12, 13 are fabricated from any mass suitable for use in a MEMS gyroscope system. In one embodiment, proof mass 12, 13 is a plate of silicon. Other materials that are compatible with micro-machining techniques may be utilized. While FIG. 1 shows two proof masses 12, 13, it is known that MEMS devices which utilize fewer or greater than two proof masses exist.

Proof masses 12, 13 are located substantially between motor drive comb 18, 19 and motor pickoff comb 20, 21. Proof masses 12, 13 also include a plurality of comb-like electrodes 26, 27, a portion of electrodes 26, 27 extending towards motor drive comb 18, 19 and a portion of electrodes 26, 27 extending towards motor pickoff comb 20, 21. While, in the illustrated embodiment, proof masses 12, 13 have four electrodes 26, and four electrodes 27, proof masses 12, 13 which incorporate other numbers of electrodes 26, 27 exist.

Proof masses 12, 13, in the embodiment shown, are supported above a respective sense plate (not shown) by suspensions 14. Corner suspensions 23 and center suspensions 25 also provide an indirect suspension of proof masses 12, 13. While four suspensions 14 are depicted in the Figure for suspending each proof mass 12, 13, other numbers of suspensions 14 exist. Suspensions 14, corner suspensions 23, and center suspensions 25, in one embodiment, are beams micro-machined from a silicon wafer. Suspensions 14 also act as springs allowing proof masses 12, 13 to move along a drive axis (X-axis) and a sense axis (Z-axis), as shown in FIG. 1.

The plurality of suspensions 14 are connected to at least one cross beam 16. Cross beams 16 are connected to at least one anchor 24 through corner suspensions 23, and center suspensions 25 and provide support for proof masses 12, 13 of MEMS gyroscope 10. Anchors 24, in one embodiment, are connected to an underlying substrate (not shown). While six anchors 24 are depicted in FIG. 1, the number of anchors 24 may be more or less than six. Anchors 24, corner suspensions 23, and center suspensions 25 are positioned along a respective cross beam 16 in any manner that provides support to MEMS gyroscope 10, and provides the desired values of the mode frequencies of the device.

Motor drive combs 18, 19 include a plurality of comb-like electrodes 28 extending towards a respective proof mass 12, 13. While motor drive combs 18, 19 are shown as having five electrodes 28, the number of electrodes 28 on motor drive combs 18, 19 typically is determined by the number of electrodes 26, 27 on the respective proof mass 12, 13.

Electrodes 26, 27 and electrodes 28 are interdigitated as they extend from respective proof masses 12, 13 and motor drive combs 18, 19 and form capacitors. Motor drive combs 18, 19 are typically connected to drive electronics, not shown in FIG. 1. The drive electronics cause respective proof masses 12, 13 to oscillate at substantially a tuning fork frequency along the drive plane (X-axis) by using the capacitors formed by the plurality of interdigitated comb-like electrodes 26 of proof masses 12, 13 and electrodes 20 of motor drive combs 18, 19. Gyroscope 10 has two closely spaced modes of oscillation. One of the modes, sometimes referred to as a motor mode, is driven by an electrostatic force, at a resonant frequency of gyroscope 10 to produce a relatively large amplitude of oscillation. When gyroscope 10 is subjected to rotation about the Y-axis, a Coriolis force is generated along the Z-axis which is proportional to the velocity of proof mass 12, 13 in the motor mode. The Coriolis force drives a second mode of oscillation of gyroscope 10, sometimes referred to as a sense mode. One or more electrodes are provided to detect oscillations in the sense mode, as described below, utilizing capacitance. A DC and/or an AC bias voltage is applied to sense electrodes, so that a motion of proof masses 12, 13 in the sense mode produces an output current.

Motor pickoff combs 20, 21 include a plurality of comb-like electrodes 30 extending towards a respective proof mass 12, 13. While motor pickoff combs 30 are depicted as having five electrodes 30, the number of the electrodes 30 on motor pickoff combs 20, 21 is typically determined by the number of electrodes 26, 27 on a respective proof mass 12, 13. Electrodes 27 and electrodes 30 are interdigitated as they extend from respective proof masses 12, 13 and motor pickoff combs 18, 19 and form capacitors. The capacitors allow MEMS gyroscope 10 to sense motion along the drive axis (X-axis). Motor pickoff combs 20, 21 are typically connected to a DC bias voltage source, not shown in FIG. 1.

Sense plates (not shown) are substantially parallel to their respective proof mass 12, 13, and form a capacitor. If an angular rate is applied to MEMS gyroscope 10 along an input axis (Y-axis) while the at least one proof mass 12, 13 is oscillating along the drive axis (X-axis), a Coriolis force can be detected by sensing motion along the sense axis (Z-axis). The capacitance is used to sense motion along the sense axis (Z-axis). An output of MEMS gyroscope 10 typically is a signal proportional to the change in capacitance caused by the motion. Sense plates (not shown) and proof mass 12, 13 are typically connected to sense electronics, not shown in FIG. 1. Sense electronics detect changes in capacitance as proof masses 12, 13 moves towards and/or away from their respective sense plates (not shown).

Figure 2:
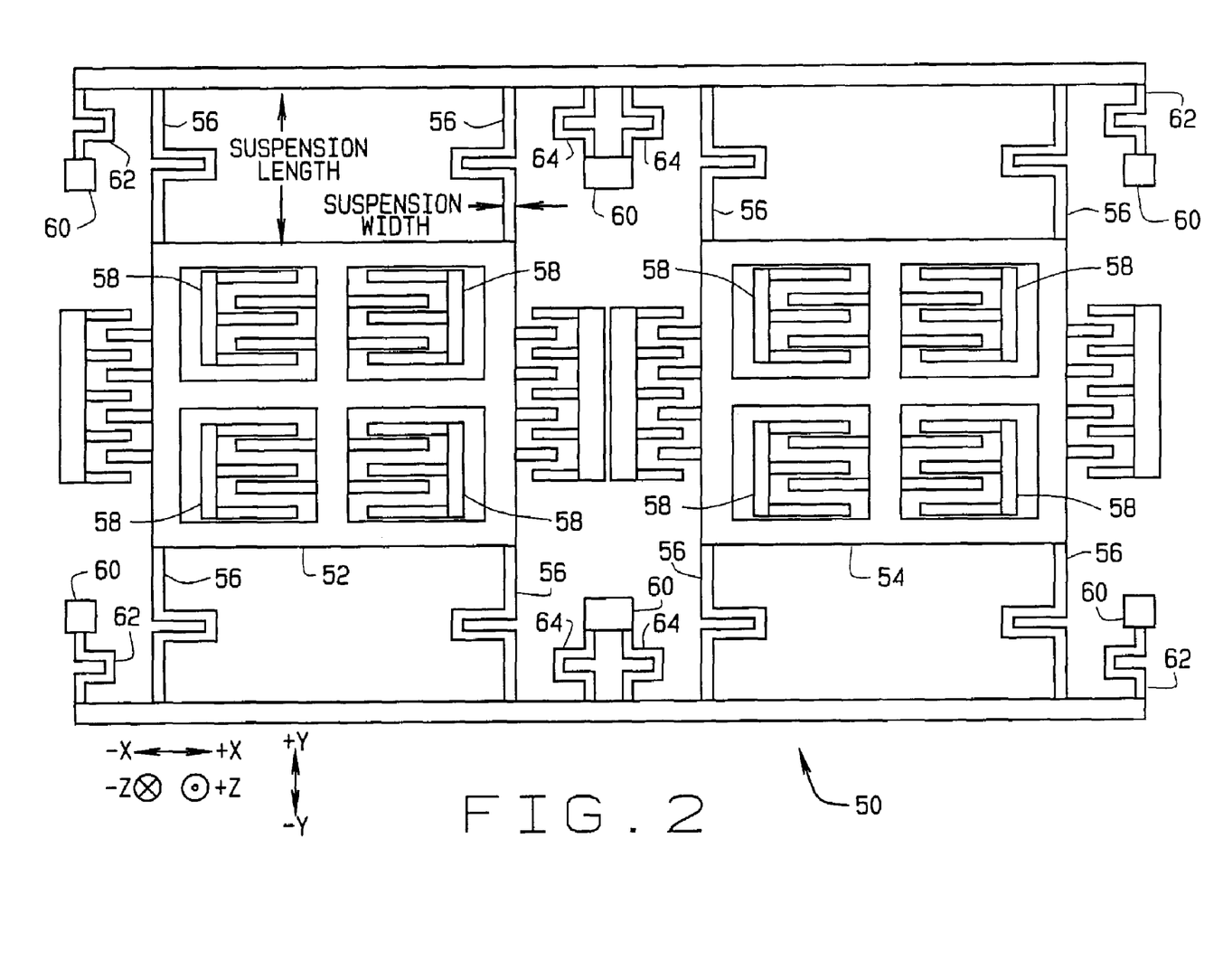
FIG. 2 is an illustration of an out-of-plane micro-electromechanical system gyroscope.

FIG. 2 shows an out-of-plane MEMS gyroscope 50, which measures rotation about the Z-axis by sensing the Coriolis force produced along the Y-axis. Out-of-plane gyroscope 50 includes two proof masses 52, 54 connected by suspensions 56 and driven into oscillation about the X-axis so that the velocities of proof masses 52, 54 are equal and opposite. In this regard, out-of-plane gyroscope 50 is similar to in-plane gyroscope 10 (shown in FIG. 1). Suspensions 56 of out-of-plane gyroscope 50 differ from suspensions 14 (shown in FIG. 1) of in-plane gyroscope 10, allowing a Coriolis force along the Y-axis to excite sense mode motion of proof masses 52, 54 along the Y-axis. The motion along the Y-axis is sensed capacitively by sense combs 58 attached to proof masses 52, 54. FIG. 2 shows sense combs 58 attached to the interior of proof masses 52, 54, but it is also possible to attach sense combs 58 to an outer perimeter of proof masses 52, 54. Gyroscope 50 includes anchors 60, corner suspensions 62, and center suspensions 64 which provide a function similar to those described with respect to gyroscope 10 (shown in FIG. 1).

A sense mode of out-of-plane gyroscope 50 involves motion along the Y-axis, parallel to the plane of the substrate, whereas the sense mode of in-plane gyroscope 10 involves motion along the Z-axis, perpendicular to the plane of the substrate. As a result, sense mode resonant frequency of out-of-plane gyroscope 50 is independent of mechanism thickness and proof masses 52, 54 and suspensions 56 may have the same thickness. In contrast, the sense mode resonant frequency of in-plane gyroscope 10 is approximately proportional to thickness, if proof masses 12, 13 and suspensions 14 have the same thickness.

Figure 3:
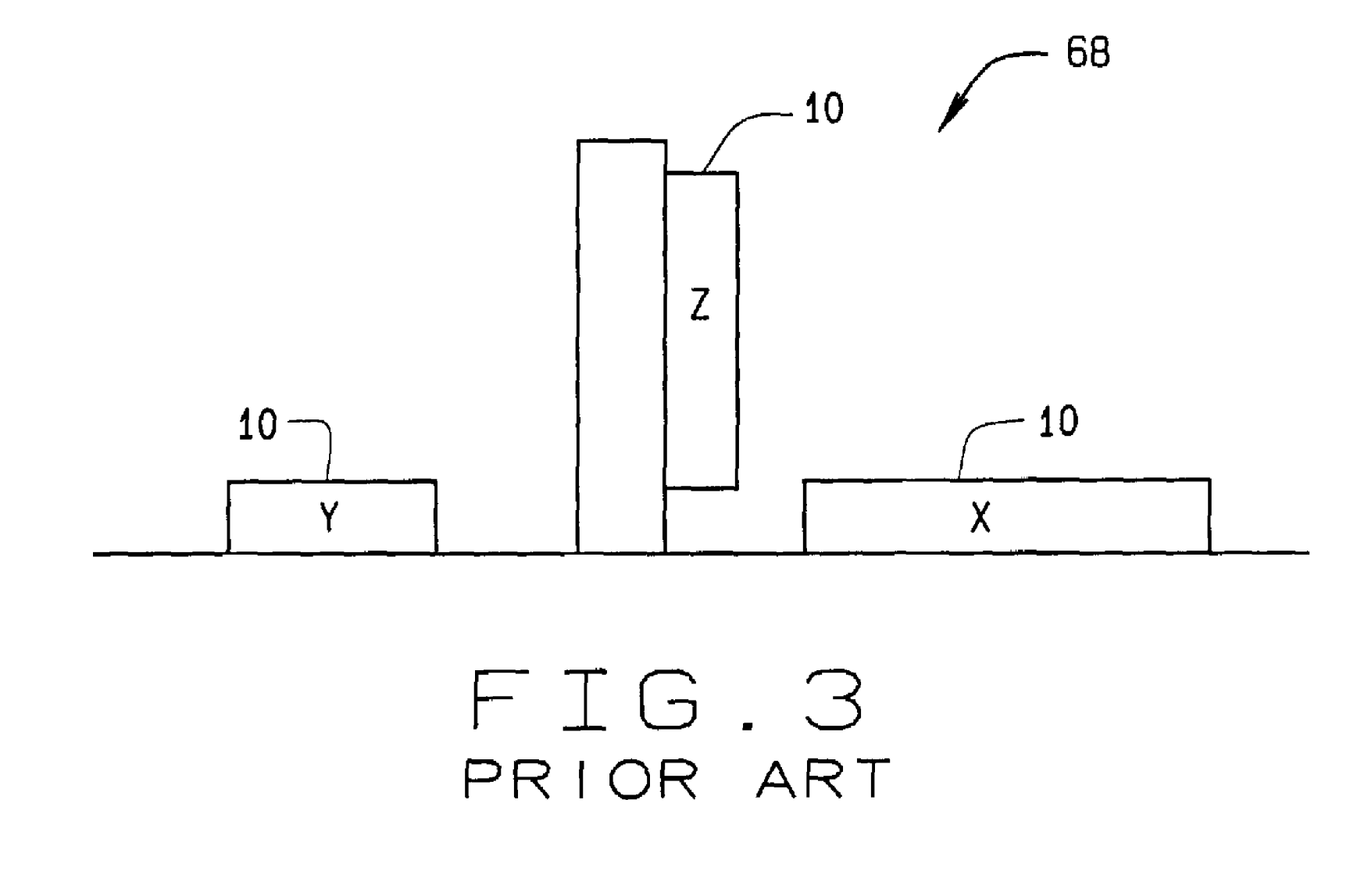
FIG. 3 is an illustration of a gyroscope portion of an inertial measurement unit.

FIG. 3 is a side view of a three-axis MEMS gyroscope portion of a inertial measurement unit (IMU) 68. IMU 68 includes three MEMS gyroscopes 10, which are described above. The three gyroscopes 10 are oriented in different positions, all orthogonal to one another, in order to measure rotation about three orthogonal axes. An alternative configuration for the three gyroscopes in an IMU utilizes at least one out-of-plane gyroscope 50, which measures rotation about an axis perpendicular to the substrate of the gyroscope. Using one out-of-plane gyroscope 50 and two in-plane gyroscopes 10, rotation about three orthogonal axes can be measured with the substrates of all three gyroscopes residing in the same plane. This configuration minimizes the volume of IMU 68.

For proper operation of an IMU which utilizes at least one out-of-plane gyroscope, the three gyroscopes should have different motor and sense frequencies, while retaining nearly identical scale factors. For example, if motor and sense frequencies of all three gyroscopes are the same, or are nearly the same, then angular random walk of IMU 68 is increased. The increased angular random walk is at least partially caused by increased electrical or mechanical crosstalk between gyroscopes. Cross-talk occurs because all three gyroscope motor resonant frequencies are close to each other. Because MEMS gyroscopes are resonant devices with a motor mode having a very high quality factor, it is difficult to prevent cross-talk between two adjacent gyroscopes having nearly the same motor mode resonant frequencies. The cross-talk can lead to intermittent phase-locking, noise, and frequency instability, when the separation between the motor frequencies of gyroscopes is less than a bandwidth of detection electronics.

At the same time, for ease in fabrication, the scale factor should be the same for all three gyroscopes. Having a motor-sense frequency separation which is the same for all three gyroscopes typically provides such a scale factor. Other factors within gyroscopes, including, but not limited to, sense capacitance, sense capacitance gap, and sense bias voltage also influence the scale factor, but typically these factors are nearly the same for all three gyroscopes within IMU 68.

Figure 4:
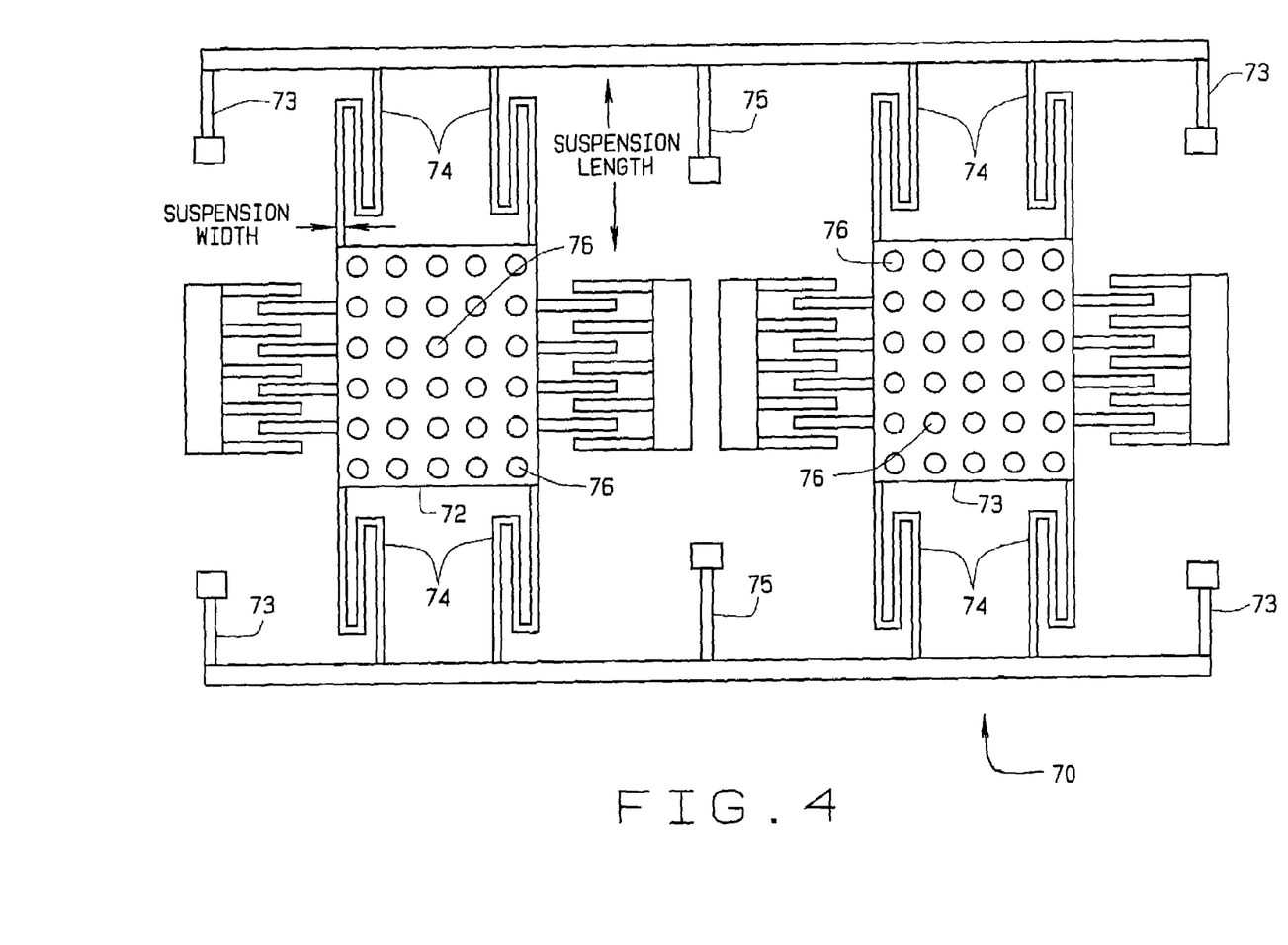
FIG. 4 is an illustration of a tuning fork gyroscope which includes holes formed in the proof masses.

For ease in fabrication processes, it is desired to be able to fabricate all three gyroscopes on a single wafer without requiring additional fabrication process steps to define the three distinct motor and sense resonant frequencies. FIG. 4 is an illustration of an example MEMS tuning fork gyroscope 70, with modified proof masses 72, 73 that allow gyroscopes with multiple motor frequencies to be fabricated on a single wafer. Gyroscopes constructed in a fashion similar to gyroscope 70 also provide uniform motor-sense frequency separation, without additional fabrication process steps as compared to known gyroscope fabrication processes. As illustrated in FIG. 4, such properties (multiple motor frequencies and uniform motor-sense frequency separation) are partially accomplished by varying the properties of proof masses 72, 73. Proof masses 72, 73 are illustrated as having a number of holes 76 formed therein. In one embodiment, holes 76 extend all the way through proof masses 72, 73. In another embodiment, holes 76 extend through only a portion of the thickness of proof masses 72, 73. Such holes 76 may be formed on one or both sides of proof masses 72, 73.

Individual proof masses 72, which are formed on a single wafer, can be fabricated with different numbers of holes 76, and/or different diameters of holes 76, which causes a resulting change in the mass of individual proof masses 72. By providing a number of proof masses 72, with varying numbers, locations, and sizes of holes 76, the mass of each set of proof masses is different, which results in a variation in the motor and sense resonant frequencies as between sets of proof masses. Varying a configuration of holes within proof masses, as further described below, to the extent that the configuration of holes within proof masses changes a mass of the proof masses, the sense and motor frequencies of the MEMS devices incorporating the proof masses changes by the same fractional amount.

A scale factor is inversely proportional to the separation between the sense and motor frequencies. Therefore, the fractional change in the scale factor due to changing the mass of the proof masses will be the same as the fractional change in the sense and motor frequencies. The required fractional variation of the motor frequencies among the three gyroscopes in an IMU is typically small, so the variation in scale factors for the three gyroscopes is also small. The small variation in scale factors can be corrected by adjusting the lengths and/or widths of proof mass suspensions 74, corner suspensions 73, and center suspensions 75. For an in-plane gyroscope, the scale factors of the three gyroscopes can be adjusted by varying the bending stiffness of the individual proof masses to adjust the sense frequencies, which results in a change in the separation between motor and sense frequencies.

The bending stiffness of a proof mass, for example, proof mass 72, is important in determining the sense resonant frequency, for a gyroscope measuring rotation about an axis in the plane of the substrate (an "in-plane" gyroscope). The bending stiffness of proof mass 72 is influenced by size and shape of the proof mass. Changing the mass of proof mass 72, for example by adding holes 76, will also generally change its bending stiffness. Both effects are considered in designing to meet the motor and sense frequency requirements. The sense frequency will also be sensitive to the location of the added or removed mass on proof mass 72, since the amplitude of bending motion in the sense mode is a function of position on proof mass 72.

It is known to utilize holes all the way through proof masses of a MEMS gyroscope for the purpose of preventing squeeze film damping of proof mass motion perpendicular to the substrate in the presence of finite gas pressure. However, variation of the number, position, size, and depth of the holes within proof masses for the purpose of varying the mass and bending stiffness of the proof masses, to provide specific gyroscope operating characteristics has not been previously described.

Figure 5:
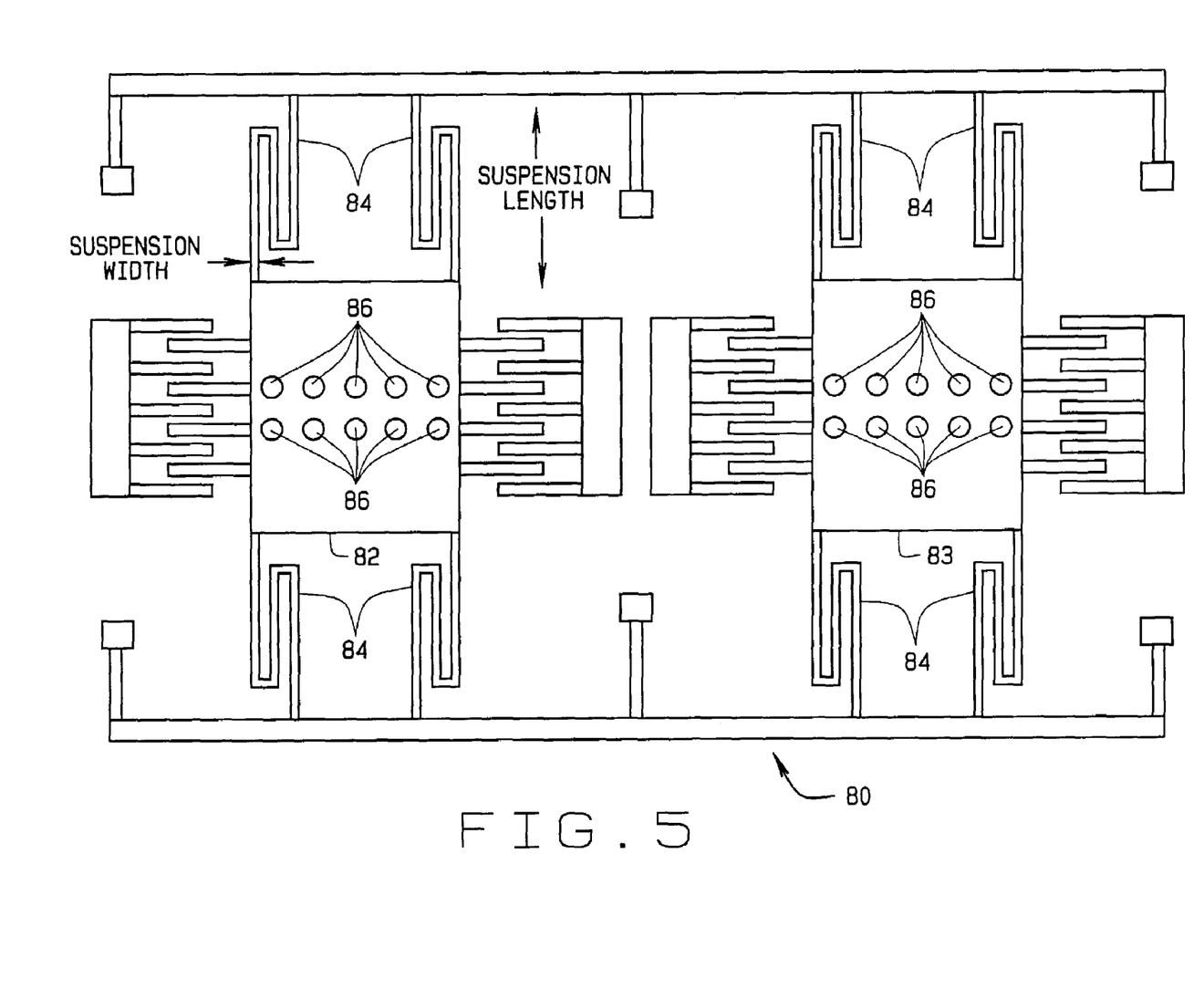
FIG. 5 is an illustration of a tuning fork gyroscope which includes a grouping of holes formed near a center of the proof masses.

FIG. 5 is an illustration of a tuning fork gyroscope 80 which includes proof masses 82, 83 suspended by suspensions 84 as described above with respect to gyroscope 70 (shown in FIG. 4). Gyroscope 80 also includes a grouping of holes 86 formed near a center of proof masses 82, 83. While holes 86 are the same diameter as holes 76 (shown in FIG. 4), the number of holes 86 is reduced as compared to holes 76. Changing both a number and a location of holes formed within a proof mass allows a designer to control both mass of proof masses, and bending stiffness, or flexibility of proof masses 82.

Figure 6:
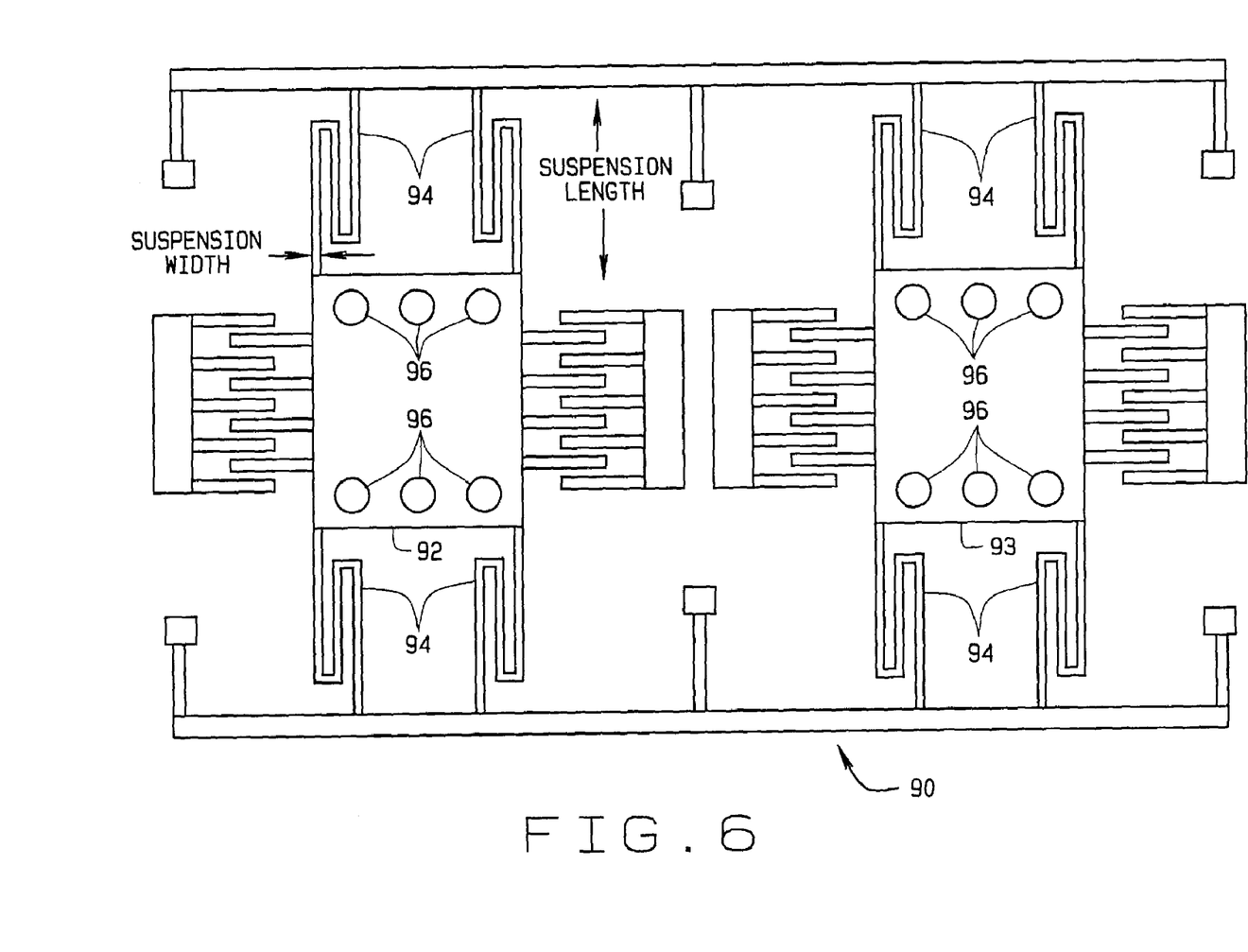
FIG. 6 is an illustration of a tuning fork gyroscope which includes larger holes formed near ends of the proof masses.

FIG. 6 is an illustration of a tuning fork gyroscope 90 which includes proof masses 92, 93 suspended by suspensions 94 as described above with respect to gyroscope 70 (shown in FIG. 4). Gyroscope 90 also includes a grouping of holes 96 which are larger in diameter than holes 76 and 86. A number of holes 96 in proof masses 92 is also different than in proof masses 72 and 82. Another distinction is that holes 96 are formed near ends of proof masses 92. Changing a diameter, a number, and a location of holes formed within a proof mass allows a designer to control both a mass of proof masses, and bending stiffness, or flexibility of proof masses. From review of the hole patterns illustrated in FIGS. 4–6, it is understood that many variations of hole diameter, hole location, and numbers of holes within proof masses can be implemented.

Figure 7:
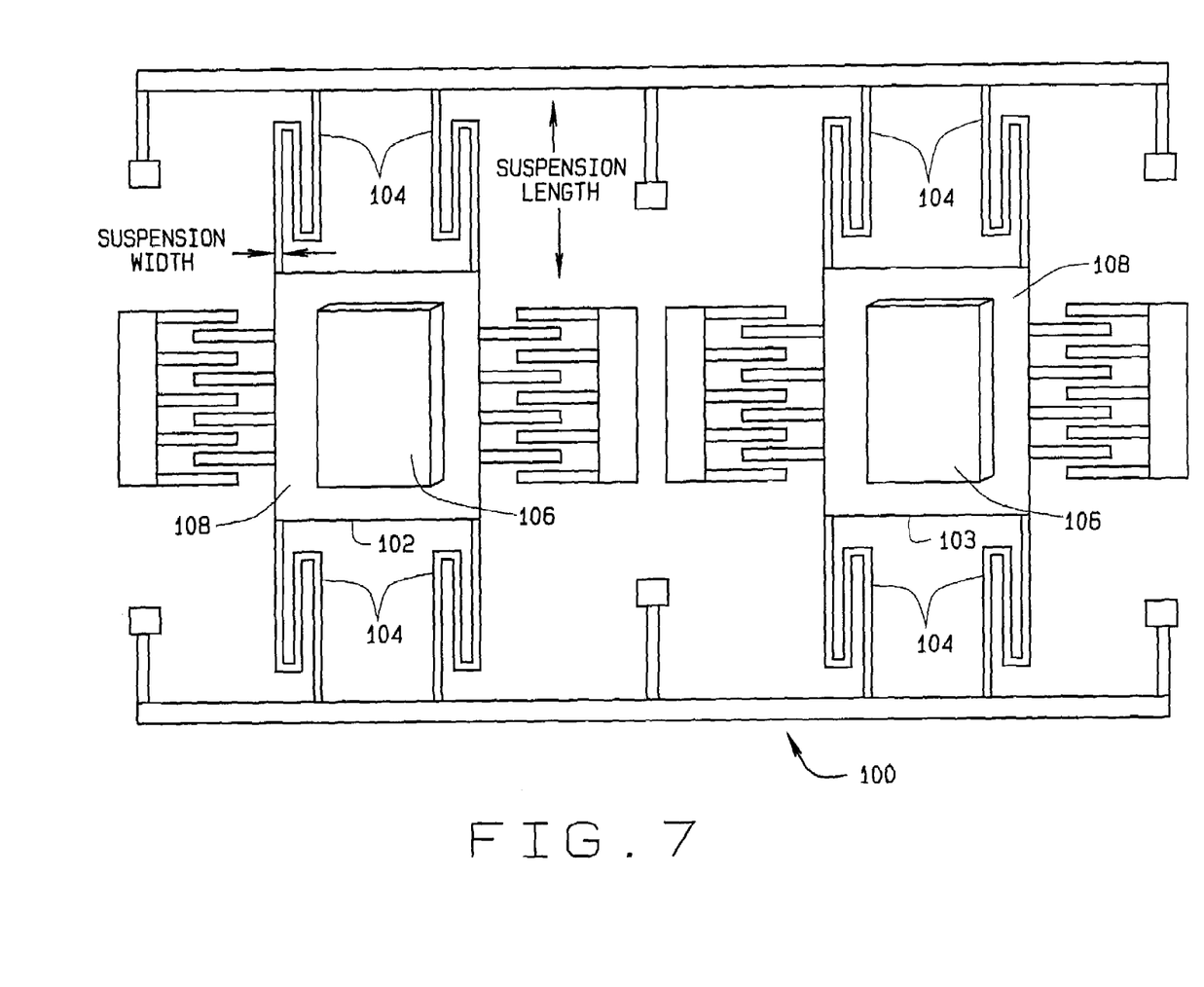
FIG. 7 is an illustration of a tuning fork gyroscope which includes a thin film material deposited onto the proof masses.

FIG. 7 illustrates an additional method for adjusting the mass of proof masses. Referring specifically to the Figure, gyroscope 100 includes proof masses 102, 103 supported by suspensions 104. Adjustments to the mass of proof masses 102, 103 are provided by depositing a thin film of material 106 onto proof masses 102, 103. In preferred embodiments, material 106 has low mechanical loss, which preserves a high Q of the resonant modes of gyroscope 100, and low internal stress, which maintains flatness of proof masses 102, 103. Three materials utilized for the thin film of materials 106 include silicon dioxide, silicon nitride, and polysilicon. While shown on a top surface 108 of proof masses 102, 103, material 106 is also effective if placed on a bottom surface (not shown) of proof masses 102, 103. Also, material 106 may be placed on both top surface 108 and the bottom surface of proof masses 102, 103, so that internal stresses in the two deposited films cancel each other, maintaining the flatness of proof masses 102, 103.

Figure 8:
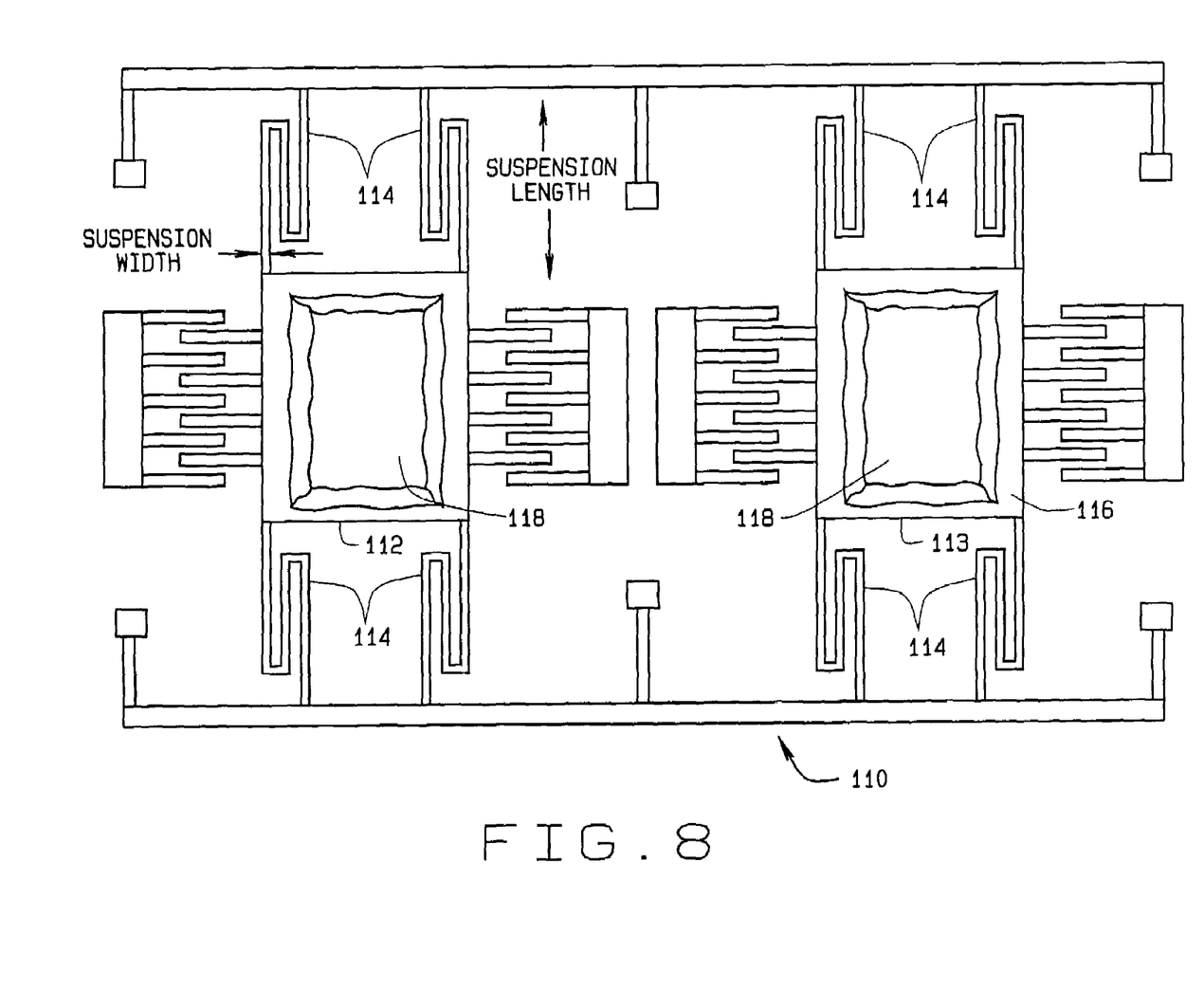
FIG. 8 is an illustration of a tuning fork gyroscope where a portion of the surface of the proof masses has been removed through etching.

FIG. 8 illustrates an additional method for adjusting the mass of proof masses. A gyroscope 110 includes proof masses 112, 113 supported by suspensions 114. Adjustments to the mass of proof masses 112, 113 are provided by etching a surface 116 of proof masses 112, 113, for example, with a reactive ion plasma etching process. Etching leaves an indentation 118 within proof masses 112, 113. While surface 116 is shown as a top surface, the etching process is effective if done on a bottom surface (not shown) of proof masses 112, 113. Also, etching may be done on both top surface 116 and the bottom surface of proof masses 112, 113.

For a gyroscope that measures rotation about an axis in the plane of the substrate, changing the stiffness of proof mass suspensions 14, corner suspensions 23, and center suspensions 25 (all shown in FIG. 1) to provide identical shifts in the motor and sense resonant frequencies typically involves changing the thickness or the length of the suspensions, as well as the width or the length of the suspensions. The suspension parameters determining the sense frequency are primarily thickness and length. The suspension parameters determining the motor frequency are width and length. The thickness and width of suspensions 14, corner suspensions 23, and center suspensions 25 are defined by two different processes, so varying both of these parameters complicates the fabrication of the gyroscope, which utilizes precisely defined motor and sense frequencies. In particular, the thickness of the suspensions is defined, for example, through at least one of a grinding and polishing process and a deposition process. In a particular embodiment, thickness of suspensions is defined through a deposition of epitaxial silicon. In one embodiment, the width of the suspensions is defined by photolithography and etching. The thickness of the epitaxial silicon is very uniform over the surface of a wafer, so providing thickness variation over the surface of a wafer would involve an extra fabrication process step. Varying the length of the suspensions is a complex design change requiring substantial changes to other parts of the gyroscope. However, varying the length has the advantage that it can be done without additional fabrication process steps, and varying the length can provide variation of the sense and the motor frequencies.

FIGS. 4–8 also illustrate lengths and widths of proof mass suspensions, corner suspensions, and center suspensions. As described above, adjustment of lengths and widths of proof mass suspensions, as well as adjustment of lengths and widths of corner suspensions and center suspensions, provide additional methods for adjustment of motor and sense frequencies. Such methods are applicable to IMUs which consist of one or more out-of-plane gyroscopes as well as other MEMS devices which incorporate suspended proof masses.

As described above, a z-axis gyroscope is a gyroscope which measures rotation about an axis perpendicular to a substrate. In a z-axis gyroscope, the sense and motor frequencies are both lateral modes (the motion is parallel to the plane of the substrate), so the frequencies of both motor mode and sense mode can be adjusted by varying only the width of proof mass suspensions, corner suspensions, and center suspensions. In fabrication, width of suspensions, corner suspensions, and center suspensions is typically defined by photolithography and etching. Thus, three gyroscope designs (for the above described IMU) having different motor frequencies and the same motor-sense frequency separation could be provided on a single wafer, without additional fabrication process steps. In such embodiments, the scale factor of the proof masses (e.g. proof masses 72, 73, 82, 83, 92, 93, 102, 103, and 112, and 113 respectively) would be identical for all three gyroscope designs.

In additional embodiments, both width and length of suspensions, corner suspensions, and center suspensions are varied to adjust the sense and motor frequencies to the proper values for each of the three gyroscope designs. Such an approach is applicable to both in-plane and z-axis gyroscope designs. Various combinations of the above embodiments can also provide the desired sense and motor resonant frequencies.

Each above described embodiment is defined by a set of parameters that can be adjusted to achieve three gyroscope designs with distinct motor frequencies but identical sense-motor frequency separations. Although described in the context of a three gyroscope IMU, the embodiments described above and below are applicable to many additional MEMS devices, including, but not limited to, accelerometers, temperature sensors, and pressure sensors. Since the values of the lengths and widths of the suspensions are defined by photolithography and etching, no additional fabrication process steps are required.

Figure 9:
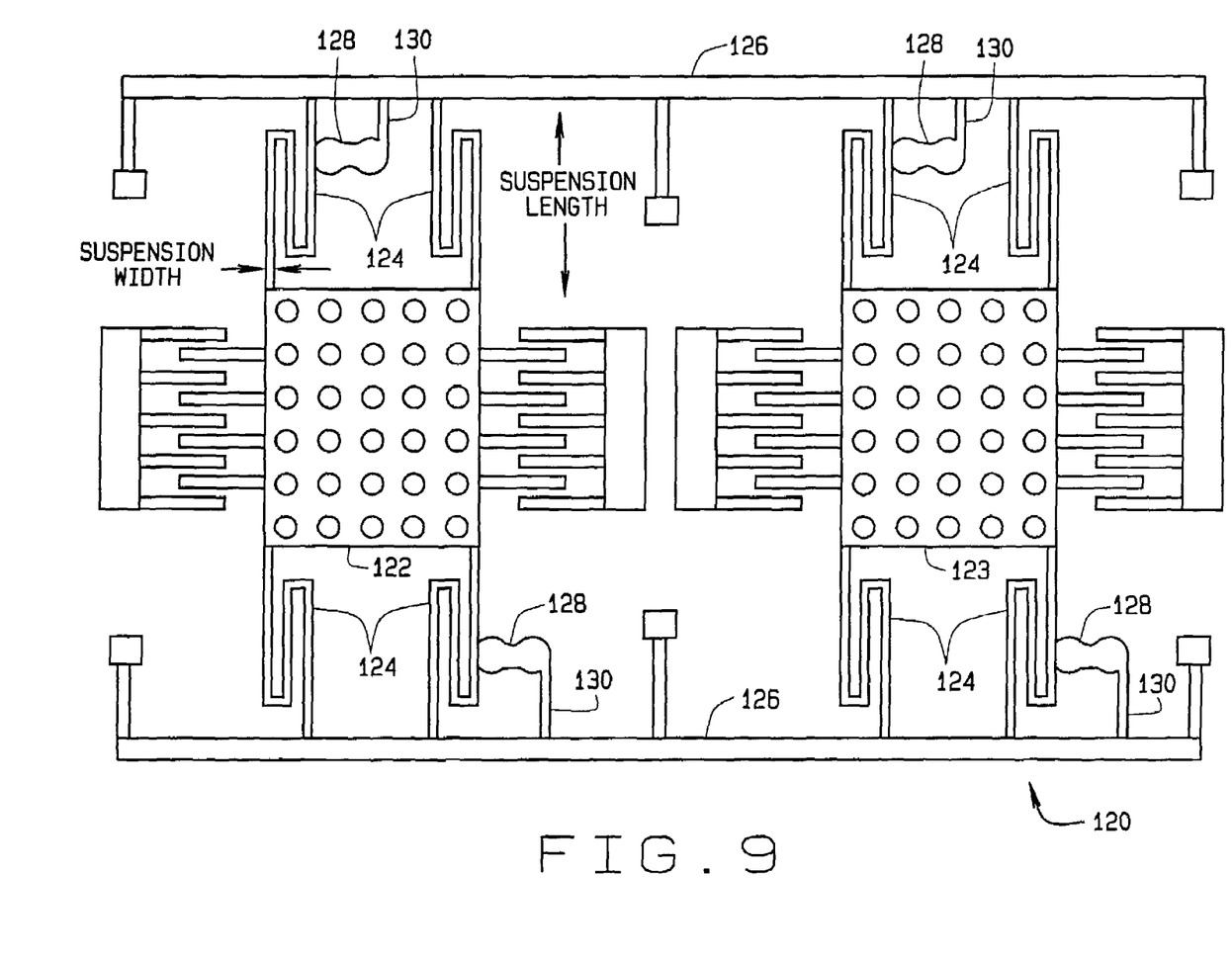
FIG. 9 is an illustration of a tuning fork gyroscope which includes stiffener beams attached through fusible links to the suspensions for the proof masses.
Figure 10:
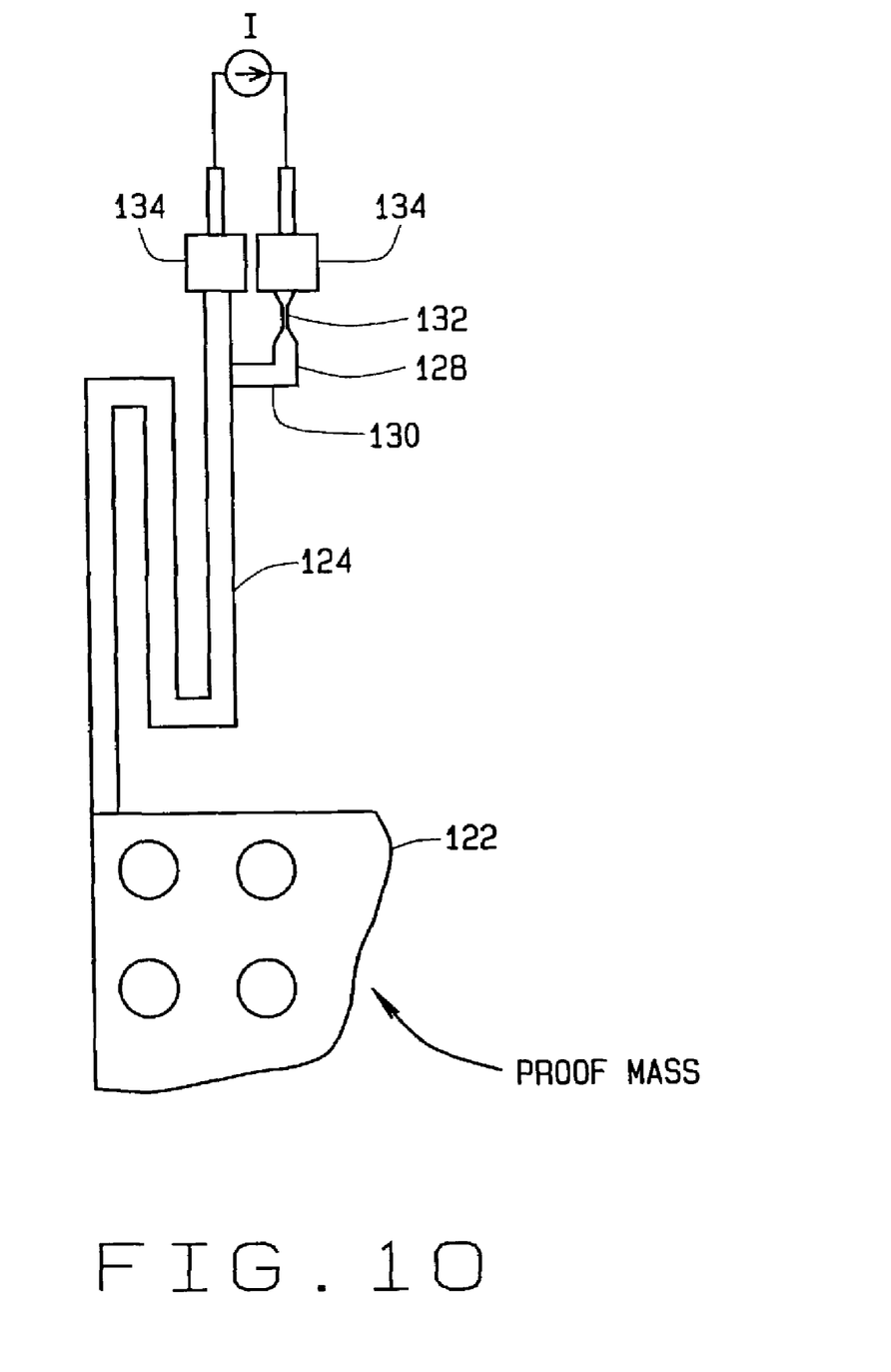
FIG. 10 is an illustration of a fusible link connected to an external current source which provides electrical heating to melt the link.
Figure 11:
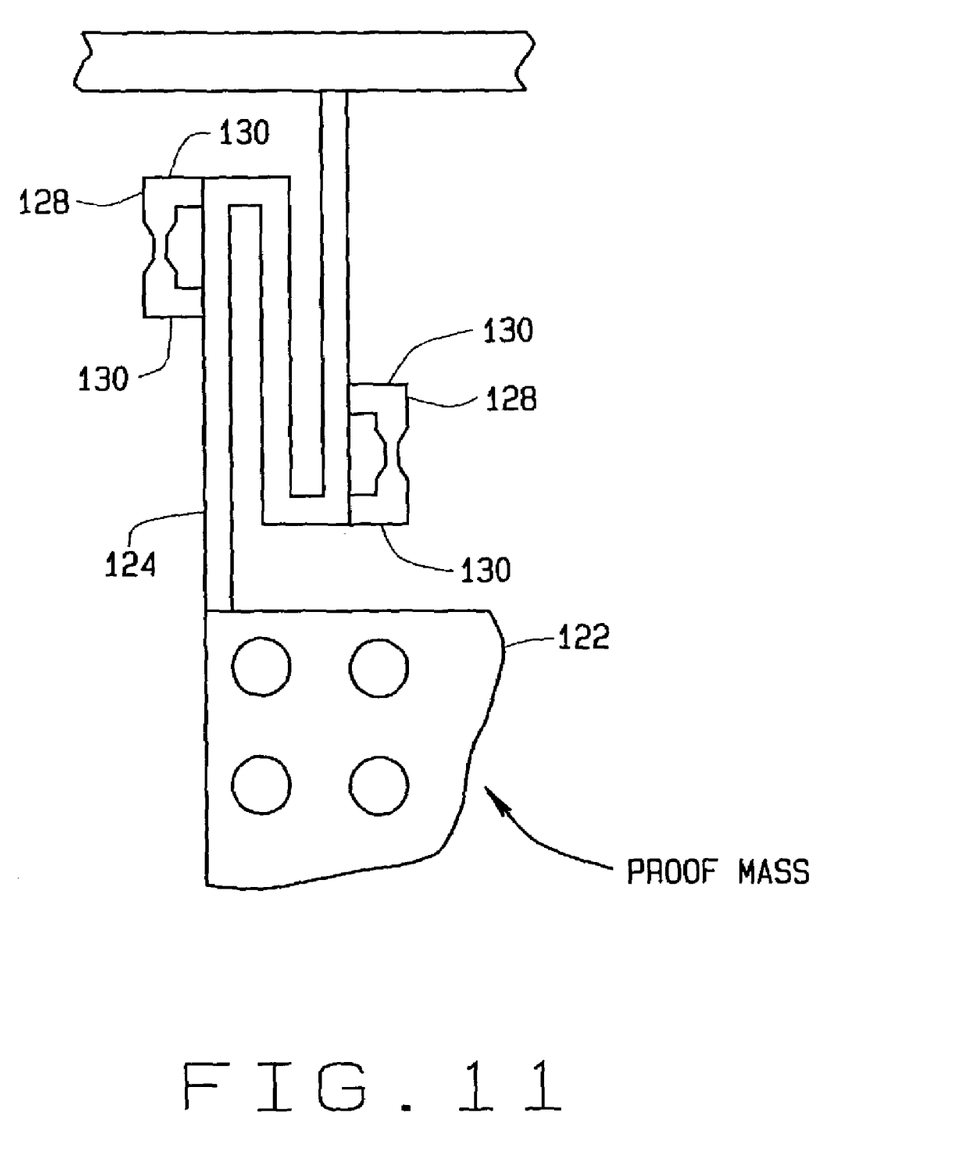
FIG. 11 is an illustration of fusible links attached to a suspension beam to allow the stiffness of two segments of the suspension to be adjusted.

A further method of adjusting the resonant frequencies of a MEMS device 120 is illustrated in FIGS. 9, 10 and 11. Device 120 includes proof masses 122, 123. A number of suspensions 124 are utilized to attach proof masses 122, 123 to one or more cross beams 126. A number of suspensions 124 include an additional fusible link 128 extending from suspension 124 to a stiffener beam 130 which is attached to cross beam 126. The resonant frequencies of device 120 are tuned after measurement of the resonant frequencies, by removing one or more fusible links 128 to alter a geometry of the individual suspensions 124. Fusible link 128 can be removed by laser cutting. Such fusible links 128 are also used to adjust the mechanical properties of suspensions 124 to improve performance of device 120 after fabrication. For example, fusible links 128 are utilized to replace a presently used procedure of laser trimming of suspensions 124 to achieve a low quadrature signal at an output of device 120.

Referring to FIG. 10, fusible links 128 include narrow sections 132 which provide an increased electrical resistance. When current is applied, as shown in FIG. 10, narrow section 132 of fusible link 128 heats faster than suspension 124 or stiffener beam 130, allowing narrow section 132 to be removed without damaging suspension 124 or stiffener beam 130. In an exemplary embodiment, a length of stiffener beam 130 is short compared to suspension 124 to avoid mechanical interference of residual sections after fusible link 128 is removed. Since maximum deflection of suspensions 124 occurs at proof masses 122, 123, stiffener beam 130 is kept relatively short. In FIG. 11, suspension 124 and fusible link 132 are shown as attached to anchors 134. It is to be understood that multiple embodiments exist for passing currents through narrow sections 132 of fusible links 128 exist.

In other embodiments, multiple fusible links 128 per support beam may be utilized to keep a symmetry of device 120 intact. For example, FIG. 11 shows two fusible links 128 connected to segments of folded beam suspension 124 to provide adjustable stiffness of the segments of suspension 124. Fusible links 128 and stiffener beams 130 are varied in size, thickness, and length, depending on a desired performance of a device, for example, device 120 (shown in FIG. 9). In addition, any combination of suspensions 124 can be configured with fusible links 128 and stiffener beams 130, depending on the application. In a specific embodiment (not shown), a plurality of stiffener beams 130 are attached between suspensions 124 (the suspensions being a pair for a single proof mass or the suspensions for adjacent proof masses), stiffener beams 130 being connected together by a fusible link 128.

Other fusible links have been used in other known MEMS devices, but not for frequency trimming. In the known devices, the fusible links were utilized to retain, for example, a proof mass to a substrate. The fusible link had to be destroyed or removed to release the device from the substrate or surrounding silicon.

The above described embodiments are utilized to adjust operational characteristics of MEMS devices. Namely, a mass of proof masses can be adjusted through one or more holes therein, a thin film of material thereon, or by etching a portion of the proof mass away. A bending stiffness of the proof mass also results and should be accounted for when fabricating and adjusting the mass of proof masses. Also, lengths and/or widths of suspensions, corner suspensions, and center suspensions for proof masses can be adjusted in varying combinations to provide desired performance parameters, without adding additional wafer fabrication steps. Fusible links extending essentially between suspensions for proof masses and cross beams can also be utilized with any or all of the above summarized methods in order to adjust performance parameters of MEMS devices.

While described with respect to MEMS tuning fork gyroscopes, the descriptions should not be construed to be so limiting. Further, while the above descriptions, specifically with respect to FIGS. 4–11, utilize an in-plane gyroscope for illustration, it should be understood that the above described embodiments are just as applicable to the out-of-plane gyroscope of FIG. 2. In addition, the above described embodiments, also apply to other MEMS vibratory devices.

While the invention has been described in terms of various specific embodiments, those skilled in the art will recognize that the invention can be practiced with modification within the spirit and scope of the claims.

What is claimed is:

1. A method for fabricating a plurality of micro-electromechanical systems (MEMS) devices on a wafer, the MEMS devices having multiple motor frequencies and uniform motor-sense frequency separation, each device including at least one proof mass suspended above a substrate by a plurality of suspensions, said method comprising adjusting a bending stiffness of the suspensions utilizing at least one fusible link attached to at least one of the suspensions as compared to at least some of the other suspensions formed on the wafer.

2. A method according to claim 1 wherein adjusting a bending stiffness of the suspensions utilizing a fusible link attached to at least one of the suspensions comprises:
   fabricating at least one fusible link which is attached to at least one suspension; and
   burning through the at least one fusible link to adjust a resonant frequency of the device.

3. A method according to claim 1 further comprising adjusting at least one of a mass of the proof mass, a bending stiffness of the proof mass, a length of the suspensions, and a width of the suspensions as compared to at least some of the other proof masses and suspensions formed on the wafer.

4. A method according to claim 3 further comprising fabricating at least one hole within the at least one proof mass to adjust both a mass and a bending stiffness of the at least one proof mass.

5. A method according to claim 4 further comprising adjusting at least one of a position, a size, and a number of holes within the at least one proof mass.

6. A method according to claim 3 wherein adjusting a mass of a proof mass comprises depositing a thin film of material onto at least one surface of the at least one proof mass.

7. A method according to claim 6 wherein the thin film material comprises at least one of silicon dioxide, silicon nitride, and polysilicon.

8. A method according to claim 3 wherein adjusting a mass of a proof mass comprises etching away a portion of at least one surface of the at least one proof mass.

9. A method according to claim 3 wherein a width of the suspensions is controlled using at least one of photolithography and etching processes.

10. A method according to claim 3 wherein a length of the suspensions is controlled using at least one of photolithography and etching processes.

11. A method according to claim 3 wherein adjusting a length of the suspensions comprises adjusting at least one of a length of proof mass suspensions, a length of corner suspensions, and a length of center suspensions.

12. A method according to claim 3 wherein adjusting a width of the suspensions comprises adjusting at least one of a width of proof mass suspensions, a width of corner suspensions, and a width of center suspensions.

13. A micro-electromechanical systems device formed on a wafer, said device comprising:
   a substrate;
   at least one sense plate attached to said substrate;
   at least one proof mass separated from said sense plate;
   a plurality of suspensions connecting said proof mass to said substrate, at least a portion of said suspensions configured to provide separation between said sense plate and said proof mass; and
   at least one anchor connecting at least one of said suspensions to said substrate, wherein to control resonant frequencies of said device, said device further comprises an adjusted bending stiffness of said suspensions based on one or more fusible links attached to said suspensions as compared to at least one other suspension for other MEMS devices formed on the wafer.

14. A micro-electromechanical systems device according to claim 13 wherein said proof mass comprises:
   a top surface;
   a bottom surface; and
   a thin film material deposit on at least one of said top surface and said bottom surface.

15. A micro-electromechanical systems device according to claim 13 wherein said proof mass comprises:
   a top surface;
   a bottom surface; and
   at least one of said top surface and said bottom surface having a portion removed through etching.

16. A micro-electromechanical systems device according to claim 13 wherein said proof mass comprises a plurality of holes formed in said proof mass, said holes being of a number, a location, and a diameter to provide a desired bending stiffness for said proof mass.

17. A micro-electromechanical systems device according to claim 13 wherein resonant frequencies of said device are controlled by adjusting at least one of a deposition of epitaxial silicon, a photolithography process, and an etching process during fabrication of said suspensions.

18. A micro-electromechanical systems device according to claim 13 further comprising a stiffener beam, said at least one fusible link extending between said stiffener beam and one of said suspensions.

19. A micro-electromechanical systems device according to claim 18 comprising:
   a plurality of said stiffener beams; and
   at least one of said fusible links extending between each said stiffener beam and a respective one of said suspensions.

20. A micro-electromechanical systems device according to claim 18 comprising a plurality of said stiffener beams attached to one or more of said suspensions, said stiffener beams connected together by one of said fusible links.

21. A micro-electromechanical systems device according to claim 13 wherein said device is one or more of a gyroscope, an accelerometer, and an inertial measurement unit.

22. A micro-electromechanical systems device according to claim 13 wherein said suspensions comprise at least one of proof mass suspensions, corner suspensions, and center suspensions.

23. A micro-electromechanical systems device comprising:
   at least one proof mass;
   a plurality of suspensions attached to said proof mass and configured to suspend said proof mass;
   at least one stiffener beam coupled to at least one of said suspensions; and
   at least one fusible link extending from each said stiffener beam, where removing said fusible link changes one or more resonant frequencies of said device by adjusting a stiffness of said suspensions.

24. A micro-electromechanical systems device according to claim 23 further comprising at least two stiffener beams, said fusible link extending therebetween, said stiffener beams both attached to a single one of said suspensions.

25. A micro-electromechanical systems device according to claim 23 further comprising an anchor, said at least one fusible link extends between said stiffener beam and said anchor, said fusible link attached to said anchor either directly or through a second said stiffener beam.

26. An inertial measurement unit comprising three orthogonally situated micro-electromechanical systems gyroscopes, each said gyroscope comprising:
   at least one sense plate;
   at least one proof mass separated from said sense plate;
   a plurality of suspensions attached to said proof mass, at least a portion of said suspensions configured to provide separation between said sense plate and said proof mass; and
   at least one anchor connecting at least one of said suspensions to said substrate, wherein to control resonant frequencies of said device, said device further comprises an adjusted bending stiffness of said suspensions based on one or more fusible links attached to said suspensions as compared to at least one other suspension for other MEMS devices formed on the wafer.

27. An inertial measurement unit according to claim 26 wherein at least one of said gyroscopes comprises a stiffener beam and at least one of said fusible links extending between said stiffener beam and one of said suspensions, resonant frequencies of said gyroscope are controlled by removing at least one of said fusible links.

28. An inertial measurement unit according to claim 26 wherein said proof mass comprises:
   a top surface;
   a bottom surface; and
   a thin film material deposit on at least one of said top surface and said bottom surface.

29. An inertial measurement unit according to claim 26 wherein said proof mass comprises:
   a top surface;
   a bottom surface; and
   at least one of said top surface and said bottom surface having a portion removed through an etching process.

30. An inertial measurement unit according to claim 26 wherein said proof mass comprises a plurality of holes formed therein, said holes varying in at least one of a size, a number, and a position for controlling a mass and a bending stiffness of said proof mass.

31. An inertial measurement unit according to claim 26 wherein said suspensions comprise at least one of proof mass suspensions, corner suspensions, and center suspensions.

32. A method for providing micro-electromechanical systems (MEMS) devices with multiple motor frequencies and uniform motor-sense frequency separation, the devices each including at least one proof mass suspended above a substrate by suspensions, said method comprising:
   fabricating at least one fusible link coupled to at least one suspension; and
   burning through the at least one fusible link to adjust a resonant frequency of the device.

* * * * *